United States Patent
Wikus et al.

(10) Patent No.: US 11,187,440 B2
(45) Date of Patent: Nov. 30, 2021

(54) CRYOSTAT ASSEMBLY WITH SUPERCONDUCTING MAGNET COIL SYSTEM WITH THERMAL ANCHORING OF THE MOUNTING STRUCTURE

(71) Applicant: Bruker Switzerland AG, Faellanden (CH)

(72) Inventors: Patrick Wikus, Nuerensdorf (CH); Steffen Bonn, Zurich (CH); Marco Strobel, Karlsruhe (DE)

(73) Assignee: BRUKER SWITZERLAND AG, Faellanden (CH)

(*) Notice: Subject to any disclaimer, the term of this patent is extended or adjusted under 35 U.S.C. 154(b) by 351 days.

(21) Appl. No.: 16/526,159

(22) Filed: Jul. 30, 2019

(65) Prior Publication Data

US 2020/0041176 A1     Feb. 6, 2020

(30) Foreign Application Priority Data

Jul. 31, 2018   (DE) .................... 10 2018 212 758.1

(51) Int. Cl.
*F25B 19/00*     (2006.01)
*F17C 3/08*      (2006.01)

(52) U.S. Cl.
CPC ............ *F25B 19/005* (2013.01); *F17C 3/085* (2013.01)

(58) Field of Classification Search
CPC ....... F17C 3/085; H01F 6/04; G01R 33/3802; G01R 33/3815; G01R 33/3804
See application file for complete search history.

(56) References Cited

U.S. PATENT DOCUMENTS

| | | | |
|---|---|---|---|
| 4,777,807 A | 10/1988 | White | |
| 5,220,800 A | 6/1993 | Mueller et al. | |
| 5,586,437 A | 12/1996 | Blecher et al. | |
| 6,011,454 A * | 1/2000 | Huang | G01R 33/3815 220/901 |
| 6,147,579 A * | 11/2000 | Einziger | F17C 13/001 335/216 |
| 2010/0236260 A1* | 9/2010 | Roth | H01F 6/04 62/51.1 |

FOREIGN PATENT DOCUMENTS

| | | |
|---|---|---|
| DE | 4039365 A1 | 10/1990 |
| EP | 0284875 A2 | 10/1988 |
| EP | 1742234 B1 | 10/2008 |
| GB | 246359 A | 3/2010 |
| GB | 2463659 A | 3/2010 |

* cited by examiner

*Primary Examiner* — Emmanuel E Duke
(74) *Attorney, Agent, or Firm* — Edell, Shapiro & Finnan LLC

(57) ABSTRACT

A cryostat assembly with an outer container for a storage tank with a first cryogenic fluid and a coil tank for a superconducting magnet coil system. The magnet coil system is cooled by a second cryogenic fluid colder than the first cryogenic fluid, the coil tank being mechanically connected to the outer container and/or to radiation shields surrounding the coil tank via a mounting structure. Liquid helium at an operating temperature of approximately 4.2 K is the first cryogenic, fluid and helium at an operating temperature of <3.5 K is the second cryogenic fluid in the coil tank. The mounting structure has mounting elements with thermally conductive contact points thermally coupled to heat sinks having a temperature at or below that of the storage tank, via thermal conductor elements. This ensures long times to quench if malfunctions occur.

20 Claims, 7 Drawing Sheets

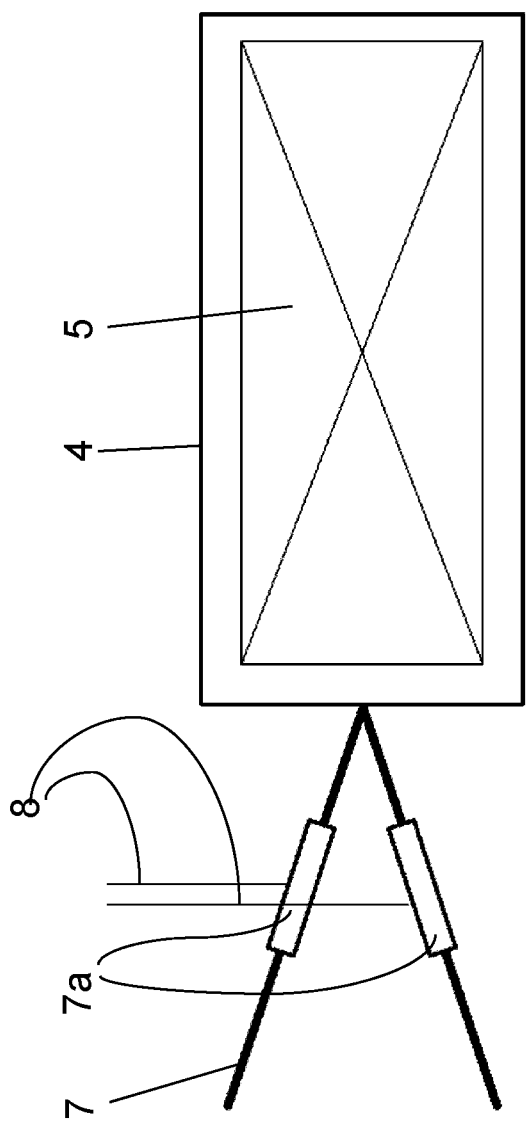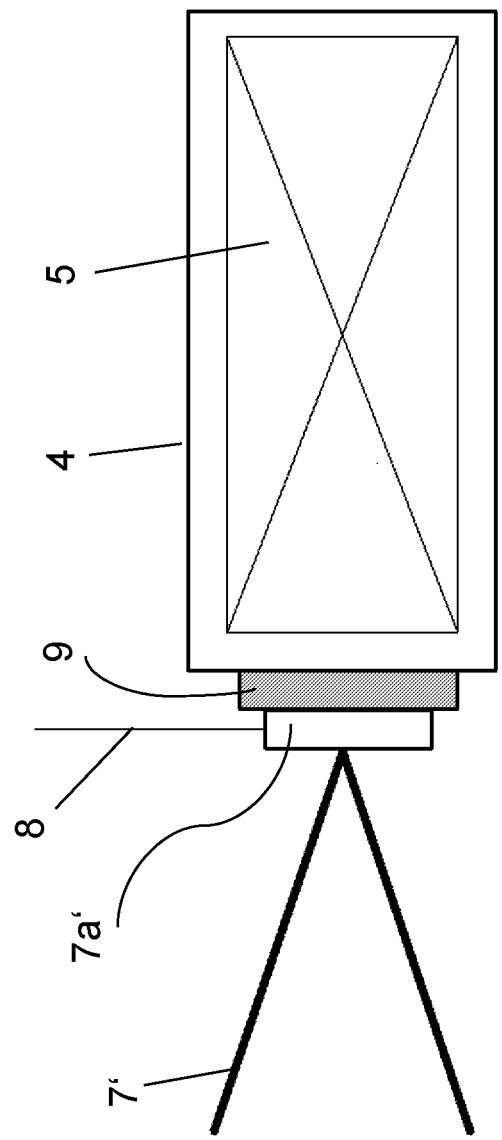

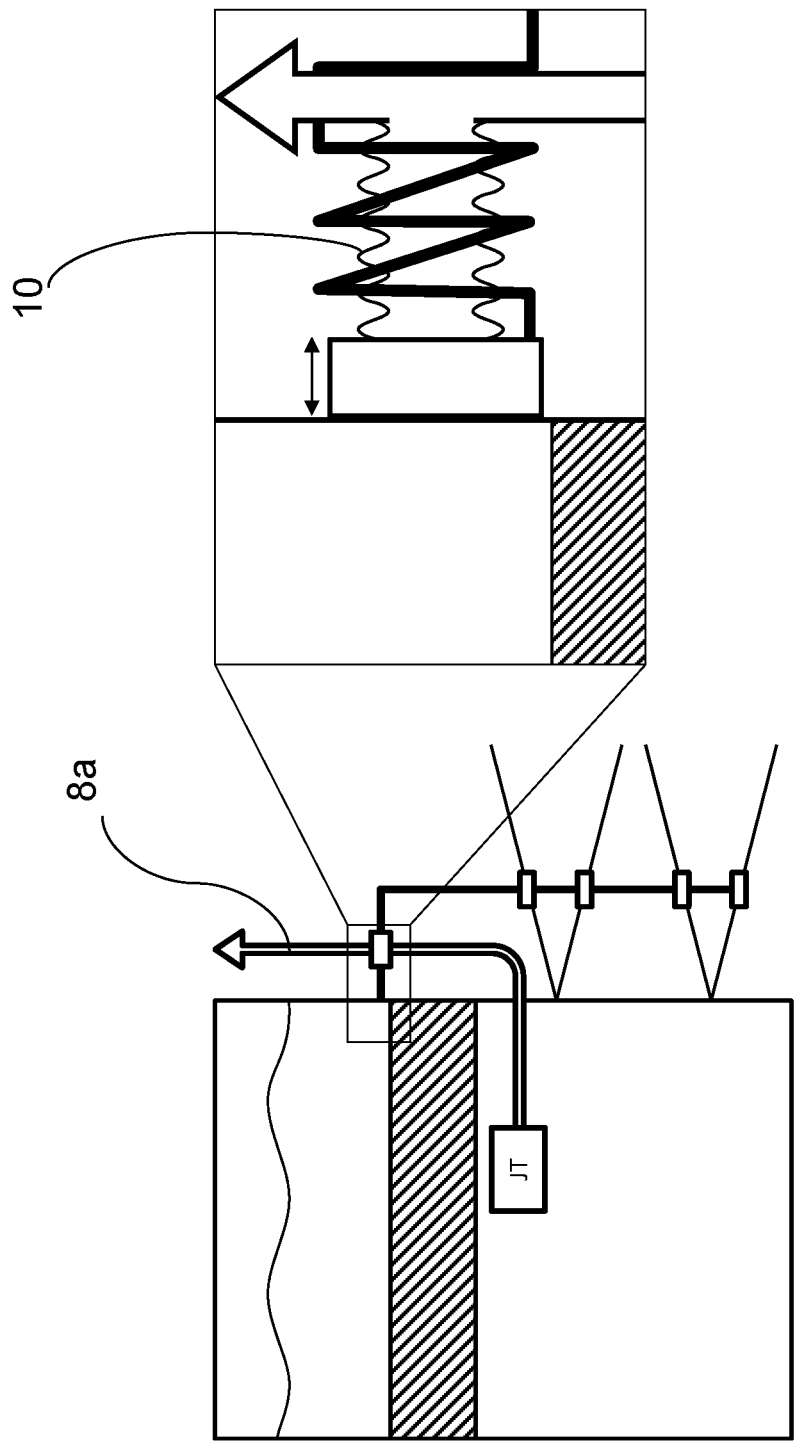

CRYOSTAT ASSEMBLY WITH SUPERCONDUCTING MAGNET COIL SYSTEM WITH THERMAL ANCHORING OF THE MOUNTING STRUCTURE

CROSS REFERENCE TO RELATED APPLICATIONS

This application claims foreign priority under 35 U.S.C. § 119(a)-(d) to German Application No. DE 10 2018 212 758.1 filed on Jul. 31, 2018, the entire contents of which are hereby incorporated into the present application by reference.

FIELD OF THE INVENTION

The invention relates to a cryostat assembly comprising an outer container in which a storage tank with a first cryogenic fluid and a coil tank with a superconducting magnet coil system to be cooled are arranged, the magnet coil system being cooled at least in an operating state by a second cryogenic fluid whose temperature is below that of the first cryogenic fluid, the coil tank being mechanically connected to the outer container and/or to one or more radiation shields surrounding the coil tank using a mounting structure at least during a transport state, and liquid helium at an operating temperature of approximately 4.2 K being selected as the first cryogenic fluid in the storage tank and helium at an operating temperature of lower than 3.5 K being selected as the second cryogenic fluid in the coil tank.

BACKGROUND

A cryostat assembly of this type is known for example from EP 1 742 234 B1 or US 2010/0236260 A1 (=reference [1]).

The present invention relates generally to the field of cooling superconducting magnet assemblies which are intended or required to be maintained at very low (=cryogenic) temperatures during operation. Superconducting magnet assemblies of this kind are used, for example, in the field of magnetic resonance, for example in MRI tomographs or NMR spectrometers. They are usually cooled using liquid helium as a cryogenic fluid.

High-resolution magnetic resonance imaging (MM) and Fourier-transform ion cyclotron resonance (FT-ICR) measurements require superconducting horizontal bore magnet systems. For high field strengths, which are necessary especially for high-resolution measurements, it is advantageous to cool the magnet coil to about 2 K instead of only 4.2 K (the boiling point of liquid helium at atmospheric pressure), as this can cause a higher utilization of the superconductor in the magnet coil.

For subcooling magnet systems, it is advantageous to use the technology described in U.S. Pat. No. 5,220,800 (=reference [2]), which is extremely reliable and has proven itself in many user systems.

For horizontal magnet systems, it has become established on the market that these systems need to be cold-transportable, i.e. the cryostat must be able to withstand the mechanical loads which occur during transport by plane, train, ship, lorry, etc.

Typically, this problem of a cold-transportable, subcooled horizontal magnet system is solved in that the mechanical mountings engage directly on the coil tank. This is advantageous because the magnet coil is by far the heaviest part of the system, and in this way a particularly short path between the outer container and the coil is mechanically produced.

Typically, the mechanical mountings comprise struts which are arranged to connect the outer container to the thermal shield and the thermal shield to the coil tank. For these struts, in the prior art a material is used which offers a good ratio of mechanical strength to thermal conductivity, such as steel or GFRP (glass fiber reinforced plastic).

For comparison: in subcooled vertical magnet systems that are not transported cold, the coil tank hangs from the storage tank and has no direct mechanical connection itself to the nitrogen tank or the radiation shield.

The approach of allowing the mechanical mountings to directly engage on the coil tank also has the advantage that the coil tank can be moved in all directions by adjusting the mechanical suspension, and thus the gaps between the room temperature tube of the bore and the inner tube of the helium tank and any intermediate radiation shields can be particularly easily adjusted.

The gap dimensions in this region are typically very small to allow efficient magnet design. However, contact between the tubes must be avoided at all costs as the heat loads on the cold parts of the cryostat would otherwise be unacceptably high.

Superconducting magnet systems are often also equipped with active cooling. The systems then usually no longer have a nitrogen tank at all. The radiation shields are cooled by an active cooler, e.g. by a pulse tube or GM cooler.

U.S. Pat. No. 5,586,437 (=reference [3]) describes a cryostat with two "thermal intercepts". However, this cryostat does not have two helium tanks. Moreover, gas cooling is mandatory for the first "thermal intercept", and an active cooler ("evaporator") is mandatory for the second "intercept".

U.S. Pat. No. 6,011,454 (=reference [4]) describes a mounting structure for a superconducting magnet. Specifically, fiber-reinforced materials are proposed. Reference is also made specifically to the need for "thermal interception" and to integrating parts with good thermal conductivity as contact points directly into the support. Again, the cryostat does not have two helium tanks in this case. Moreover, the mounting structures disclosed in reference [4] necessarily have a conical-cylindrical shape.

Reference [1], cited at the outset, describes a generic subcooled horizontal cryostat with two tanks (coil tank, storage tank). However, the problem of thermally anchoring the mounting structure is not discussed. The coil tank is, as already mentioned above, cooled to a temperature of about 2 K. This is done with a Joule Thomson refrigerator, in which helium is expanded. A rotary vane pump is usually used for pressure reduction.

A disadvantage of the currently known prior art is that the heat flowing through the mechanical mounts passes directly into the coil tank, and has to be absorbed just where the least cooling capacity is naturally available.

This prior art proves disadvantageous in the case of failure of one of the active cooling systems:

If the pump that is used to expand the helium fails (for example, in the event of a power failure or mechanical fault of the pump), the heat that flows through the mechanical suspension into the coil tank causes the coil tank to warm up relatively quickly.

In the event of a failure of the active cooler which cools the radiation shield or when, in the case of a tank filled with liquid nitrogen, this tank is completely emptied, the shield temperature rapidly increases due to the relatively low heat capacity of the shield or low heat capacity of the empty tank, which leads to a large increase in the heat load on the coil tank (in a first approximation, the heat load on the coil tank increases quadratically with the temperature of the shield).

Heating of the coil tank is extremely critical, however, since the magnet coil already quenches if the design temperature is slightly exceeded (i.e. transitions into the normal conducting state in which the high energy stored in the coil current is very rapidly converted into heat due to the then ohmic resistance of the coil).

SUMMARY

Accordingly, an object addressed by the present invention, which when considered in detail is relatively challenging and complex, is that of improving a cryostat assembly of the type described at the outset with a superconducting magnet coil system using a technical approach that is as uncomplicated as possible, so as to avoid the above-discussed disadvantages of known generic assemblies. In particular, the cryostat assembly should allow a sufficiently long time to quench in the case of malfunction, and at the same time be simple and reliable in construction and inexpensive to manufacture.

This object is addressed by the present invention in a surprisingly simple and effective manner in that, in a cryostat assembly of the type defined at the outset, the mounting structure comprises a plurality of mounting elements which each have at least one thermally conductive contact point which is thermally coupled in each case to at least one heat sink, whose temperature is lower than or equal to that of the storage tank, via at least one thermal conductor element.

The basic concept of the present invention consists in dissipating the heat which flows into the system via the mechanical suspension in such a way that it flows into the heat sink instead of into the coil tank.

In the event of a failure of the pump or cooling of a radiation shield, the coil tank temperature will increase much more slowly and the time to quench will increase significantly.

The following advantages are achieved in particular with the present invention:

The heat load on the coil tank can be considerably reduced by the design of the mounting structure, which is significantly more efficient in terms of its thermal properties.

In actively cooled systems, this allows the use of a cooler with lower cooling capacity, which, for example, has an advantageous effect on the power consumption and system costs.

In the case of bath-cooled systems, this leads to a reduction in the evaporation rate of the cryogenic fluid. This results in a significant reduction in operating costs, and the time interval in which the cryogenic fluid (typically helium) needs to be replenished also increases, which reduces disturbances associated with long-term nuclear magnetic resonance measurements and, overall, increases the availability of the system for NMR measurements.

A main advantage of the present invention is that the heat input via the mounting elements from the outer container and/or from the radiation shields does not flow directly into the coil tank, but is discharged into the heat sink, and the cooling of the heat sink is carried out thermodynamically more efficiently than the cooling of the coil tank. This is achieved by operating the heat sink at a higher temperature than the cooler used to cool the coil tank. Embodiments in which the heat sink comprises the storage tank make use of the fact that cooling capacity is "more cost-effective" at the higher temperature of the storage tank (about 4.2 K instead of T<3.5 K).

This is particularly relevant in two specific scenarios:

Cooling Failure of the Radiation Shield:

The shields are typically cooled with liquid nitrogen or with a cryocooler (e.g. a pulse tube cooler). If the cooling of the radiation shield fails, the temperature of the shield increases rapidly. In a first approximation, the heat flow through the mounting elements increases with the square of the shield temperature (both the thermal conductivity of the mounting elements and the temperature gradient driving the heat flow increase linearly with the shield temperature).

Cooling Failure of the Coil Tank:

The coil tank is usually cooled using a Joule Thomson cooler, in which helium is expanded to a low pressure and thus cooled. If active cooling of the coil tank fails, the tank begins to warm up slowly. If a particular maximum temperature is exceeded, the magnet quenches. The warm-up rate is determined by the "thermal mass" of the coil tank (i.e., in a first approximation, the heat capacity of the tank, coil and helium) and the heat load on the coil tank. The heat load on the coil tank is usually dominated by the heat flow through the mounting elements. When this heat flow can be reduced, the warm-up rate decreases and the time to quench becomes longer, making the operation of the system safer and less prone to failure.

An embodiment of the cryostat assembly according to the invention is preferred in which the second cryogenic fluid is subcooled helium, the pressure of the subcooled helium being above the saturation vapor pressure corresponding to the temperature of the second cryogenic fluid.

Typically, the second cryogenic fluid is operated at the same pressure as the first cryogenic fluid—usually this pressure is 5 to 100 mbar above atmospheric pressure. Such a mode of operation avoids pressures below atmospheric pressure prevailing in the storage tank or in the coil tank, which increases the reliability of the system: in the case of a small or large leak or in the case of maloperation, air cannot be "sucked" into the helium tanks. This would lead to icing, which in turn could block important outflow lines, which are absolutely necessary, for example, in the case of a quench.

The outer container will usually be designed as a vacuum container to ensure high thermal insulation between the components within the container.

Also advantageous are embodiments of the invention in which the mounting elements are made of a material for which, for the ratio $\sigma/\theta$ of maximum permissible mechanical stress $\sigma$, with $\sigma > 100$ MPa, to the integral $\theta$ of the thermal conductivity $\lambda$ over the temperature range $\Delta T$ between 300 K and 4 K, with $\theta < 300$ W/m, the following applies: $\sigma/\theta > \frac{1}{3}$ (MPa·m)/W.

The heat load on the cryogenic tank can be significantly reduced by such a design of the mounting elements, which is more efficient in terms of thermal properties. In actively cooled systems, this allows the use of a cooler with lower cooling capacity, which, for example, has an advantageous effect on the power consumption and system costs. In the case of bath-cooled systems, this leads to a reduction in the evaporation rate of the cryogenic fluid. This results in a significant reduction in operating costs, and the time interval in which the cryogenic fluid (helium) needs to be replenished also increases, which reduces disturbances associated with long-term nuclear magnetic resonance measurements and, overall, increases the availability of the system for NMR measurements. In the event of failure of an active cooling system (e.g. a pulse tube cooler or a Joule Thomson cooler), the time to quench of a system is increased if the mounting elements are designed efficiently.

Further preferred embodiments of the invention are characterized in that the mounting elements are made of plastics material, preferably of fiber-reinforced plastics material, in particular of GFRP, particularly preferably of the fiber composite material G10. These plastics materials meet the requirements for strength and thermal conductivity particularly well. In fiber composite materials such as G10, the fibers give the component particularly high strength. The ratio of strength to thermal conductivity is important for the mounting elements. The use of carbon fiber is also possible, but only at a temperature below 80 K, which results in an even better ratio of strength to integral thermal conductivity.

The thermal conductivity integral of stainless steel is about 30 times greater than that of G10. However, stainless steel is also considerably stronger than G10. The 0.2% yield strength of stainless steel used by the developer for the design is typically 360 MPa (for 1.4301); the tensile strength of G10 is about 270 MPa.

Even under the conservative assumption that a safety factor of 3 is applied to tensile strength for G10 and that stainless steel can be loaded up to its yield point, heat conduction through a stainless steel mounting element $[(270/3 \text{ MPa})/(1 \text{ W/cm})]/[(360 \text{ MPa})/(30 \text{ W/cm})]=7.5$ times larger than a GFRP mounting element with the same load-bearing capacity.

A class of embodiments of the invention is characterized in that the mounting elements are designed as strut elements, and in that the thermally conductive contact points are glued onto or into the strut elements or are co-wound in a wound structure of the strut elements.

This solution has the advantage that the strut elements can be connected directly to the coil tank, which is particularly favorable from a mechanical point of view, i.e. in terms of the strength of the structure. In order to ensure the efficient dissipation of the heat (specifically with minimal temperature gradients between the contact point and the strut at the point where the contact point is attached to the strut), it has proven favorable to glue the contact points directly onto the strut. Adhesives with high thermal conductivity are particularly suitable for this purpose.

In strut elements made of fiber-reinforced plastics material, it is particularly advantageous if the contact points can be integrated directly in the strut elements during production of the strut elements. Then a particularly good dissipation of the heat flow flowing through the strut element is ensured in the contact point.

In a usually alternative class of embodiments, the mounting elements are in the shape of a loop, each loop having at least one thermally conductive contact point.

A loop made of GFRP is particularly favorable because the fibers in the material can then also be wound as a loop. Fiber composite materials lose some of their advantages when the fibers are broken in the workpiece (e.g. short fiber materials or workpieces whose mechanical processing cuts through the fibers). Any break of a fiber mechanically weakens the workpiece.

In addition, it is particularly easy in loop-shaped mounting elements to preload them during installation so that they are subjected to tension under all loads occurring during operation. Pressure loads can lead to unstable failure (kinking). Parts that need only to be tensioned can be made with a thinner cross-section. This in turn helps to keep the heat load small.

Embodiments of the cryostat assembly according to the invention are also advantageous which are characterized in that the mounting elements have, on their end nearer the coil tank, a thermally conductive contact point which is in mechanical surface contact with the coil tank via a thermally insulating plate on the side facing away from the mounting element. In these embodiments, the mounting elements are not "broken" by the contact point. This makes the mounting elements easier and cheaper to produce. The thermal insulating plate is typically a GFRP plate. This can be cut out in a suitable manner to reduce the heat conduction through the plate.

The thermal conductor elements for thermally coupling the contact points of the mounting elements to a heat sink can be designed in different ways depending on the application:

One class of embodiments is characterized in that the thermal conductor element is constructed from a strand or a rod and is made of a material with high thermal conductivity lambda at low temperatures, in particular lambda >250 W/(m*K), preferably lambda >500 W/(m*K), at a temperature of 4 K, preferably made of high-purity copper or high-purity aluminum.

It is favorable if the smallest possible temperature gradient is formed by the thermal connection between the contact points and the storage tank for a given heat flow. This ensures that the temperature reached at the contact points on the strut elements is minimal and the heat input into the coil tank is as low as possible. The temperature gradient across the thermal connection elements can be made small if the cross-section of the connection elements is selected to be large, if their length is small, and if their thermal conductivity is high. Large cross-sections are structurally difficult because the resulting large components are difficult to accommodate in the confined conditions of a cryostat. This conflicts with the desire to design magnet systems to be as compact as possible. The length of the thermal connection elements is often not freely selectable, since the distance between the storage tank and the contact points is specified by other design criteria (such as the size of the coil). The most efficient way to achieve a low temperature gradient is therefore to use suitable high-conductivity materials. In cryogenics, copper or aluminum is often used for such purposes. It is important to ensure that the materials used are as pure as possible from impurities, and also have no dislocations in the material structure. This further improves the thermal conductivity at low temperatures.

Another class of embodiments is characterized in that the thermal conductor element comprises a heat pipe or is constructed from a heat pipe. Heat pipes are particularly good heat conductors whose function is based not on the heat conduction in a solid, but on convection in a fluid. In this specific case, mainly helium-filled heat pipes would be considered. All other fluids would already be frozen at the extremely low temperatures.

Embodiments of the invention in which at least one heat sink comprises the storage tank, in particular consist of the storage tank, are also preferred. In this particular embodiment, the heat pipes can be connected directly to the storage tank, i.e. the tube is then filled with liquid helium at about 4.2 K. At the contact point, the helium evaporates from the mounting elements due to the heat supply and rises in the form of gas bubbles into the storage tank, specifically through the same tube through which the liquid helium flows to the contact points.

In another class of embodiments, the thermal conductor element comprises a radiation shield, in particular a 4.2 K radiation shield, or is constructed from such a shield.

An important requirement for a radiation shield is that it is as isothermic as possible. This usually requires that the radiation shield be made of a material with good thermal conductivity, and that the geometry of the radiation shield be selected so that from each point of the radiation shield good heat transfer is possible to the point where the radiation shield is connected to the "heat sink". This requirement is identical to the requirement placed on the thermal conductor element according to the invention, which is why it is advisable to combine the two components with one another. The contact points are then connected directly to the radiation shield. This is particularly simple in the embodiment described above with the thermally insulating plate, since it is readily possible here to design the radiation shield to be optically dense. If the contact points are integrated directly into the mounting elements, cutouts must be provided in the radiation shield for implementing the mounting elements, which then have to be optically sealed in a suitable manner, for example by superinsulation.

Advantageous developments of these embodiments are characterized in that the thermal conductor element comprises tube loops through which the contact points and the storage tank are thermally coupled, the tube loops branching away from the storage tank below a liquid surface of the first cryogenic fluid, leading to the contact points, and then being returned to a location on the storage tank which is above the liquid surface.

Similarly to the solution with heat pipes described above, it is possible to connect the contact points directly to tube loops, which in turn are connected to the storage tank. Helium from the storage tank can thus flow through these tube loops to the contact points. There, the heat from the mounting elements is absorbed by the helium, which evaporates as a result. The gaseous helium then rises through the second branch of the tube loop back into the storage tank, where it is introduced directly into the gas phase. The movement of the fluid through the tube loop is driven by natural convection, i.e. completely passively. When designing the tube loop, it must be ensured that the rising gas bubbles can easily escape upward, i.e. that the return line to the gas phase in the storage tank does not have downward passages that are too long.

In a further preferred embodiment of the cryostat assembly according to the invention, an active cooler, in particular a Joule Thomson refrigerator, is provided with subcooling pumps, which can continue to be operated by an uninterruptible power supply in the event of a power failure. At least one heat sink comprises the exhaust gas of the active cooler, and an exhaust gas line of the active cooler is moved past the contact points serially or in parallel with thermal contact.

For cooling to temperatures below 4.2 K, a Joule Thomson cooler is very often used. This cooling process relies on expanding helium. In magnet systems, liquid helium is often expanded to a pressure of between 2 and 100 mbar, and the resulting cooling capacity is used to cool the magnet coil. Gaseous helium with a temperature of <4.2 K then flows out of the JT cooler to the pumps, which are typically provided at room temperature. The enthalpy of the cold gas can be used to cool components inside the cryostat, e.g. radiation shields or even the contact points of the mounting elements. The gas then flows from the JT cooler to the contact points at a temperature of typically between 1.0 and 3.5 K, picking up heat from the mounting elements, warming up, and then possibly flowing on to other components which also need to be cooled. The cooling capacity in the exhaust gas of the JT cooler has two main advantages: for one, it is practically available "gratis", since the gas must be pumped out anyway. In addition, it is available at very low temperatures (namely even at the temperature of the coil tank). The use of the exhaust gas of the active cooler is therefore thermodynamically particularly favorable.

In principle, the contact points can be cooled only by the cold gas in the exhaust gas line. However, this solution has the small disadvantage that the cooling capacity at the contact points is not available when the JT cooler is not in operation (e.g. because it has failed). It is therefore advantageous to connect the contact points both to the exhaust gas line and to the storage tank. If the JT cooler fails, the contact points are cooled by the connection to the storage tank. In the design, it is important to ensure that the qualities of the two thermal connections are well matched; this is done according to thermodynamic principles that are well known to a person skilled in the art. Specifically, it is about avoiding a perfect thermal connection of the contact points to the storage tank. The contact points would then in particular always be the temperature of the storage tank, and the cooling of the contact points by the exhaust gas from the JT cooler would be ineffective. On the other hand, the thermal connection of the contact points to the storage tank must not be too bad, otherwise it has no effect if the JT cooler is not in operation. How the two thermal connections are matched to one another depends on the details of the specific application.

Matching the thermal conductivities of the thermal connections can be omitted if the thermal contact between the storage tank and the exhaust gas line is designed to be movable. Particularly elegant here is a solution in which the connection is opened or closed depending on the pressure in the exhaust gas line, in particular by a mechanically preloaded bellows element which is connected to the interior of the exhaust gas line and over which contact can be made or broken, the bellows element being designed such that thermal contact is made only above an exhaust gas line pressure of 100 mbar.

In normal operation, there is a low pressure in the exhaust gas line, typically <100 mbar. In this operating state, the contact points should have no thermal connection to the storage tank; the contact points are cooled by the cold gas in the exhaust gas line. If the JT cooler fails (e.g. if the mechanical pumps fail), the exhaust gas line runs full and soon reaches a pressure of >100 mbar. The thermal contact with the storage tank can now be carried out via a bellows and a spring preload so that this contact is automatically made at a pressure >100 mbar. In this case, the storage tank takes over the cooling of the contact points.

The present invention can be used with particular advantage when a room temperature bore with a horizontal axis is provided in the cryostat assembly. Horizontal magnet bores are especially favorable precisely for MRI systems, since the object to be examined (e.g. a human or an animal) can then be placed horizontally in the test chamber in the magnet center. In systems where liquids are predominantly analyzed, vertical magnet bores are often used to ensure that the liquid surface is not within the sample volume.

Within the bore the space is very limited, and the distances between the wall of the outer container, the coil tank and any intermediate radiation shields are very small. However, contact must be avoided at all costs. In the case of vertical magnet bores, the gravitational vector is parallel to the axis of the bore, i.e. deformations due to its own weight usually do not lead to contact of the components (radiation shields, etc.) within the bore. This is not the case with horizontal bore systems, which is why the coil tank suspensions need to be particularly tight on horizontal bore systems.

Further advantages of the invention can be found in the description and the drawings. Likewise, according to the invention, the features that are mentioned above and set out in the following can each be used individually per se or together in any combinations. The embodiments shown and described are not to be understood as an exhaustive list, but instead are of an exemplary nature for describing the invention.

BRIEF DESCRIPTION OF THE DRAWINGS

The invention is illustrated in the drawings and will be explained in more detail with reference to embodiments. In the drawings:

FIG. 3 is a schematic detailed view of an embodiment of the cryostat assembly according to the invention with a mounting element in which the thermally conductive contact points are integrated;

FIG. 4 is a detailed view of an embodiment with a mounting element which is provided, at its coil-tank-side end, with a contact point, and is in mechanical surface contact with the coil tank via a thermally insulating plate;

FIG. 8 shows an embodiment in which a mechanically preloaded bellows element is arranged in the region where the exhaust gas line and thermal conductor element cross, over which bellows element thermal contact can be made or broken.

DETAILED DESCRIPTION

Figure 1:
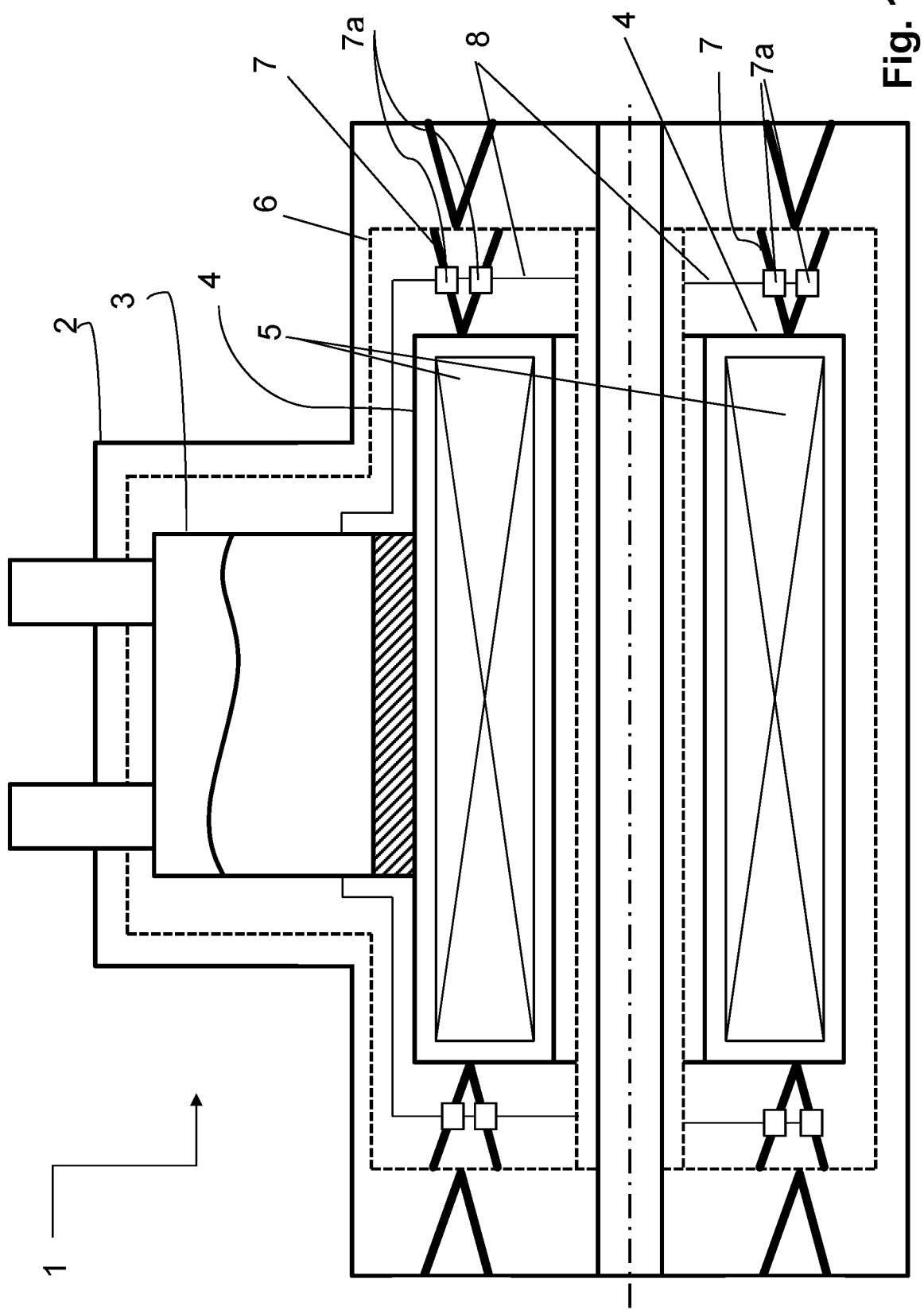
FIG. 1 is a schematic vertical sectional view of an embodiment of the cryostat assembly according to the invention.
Figure 2:
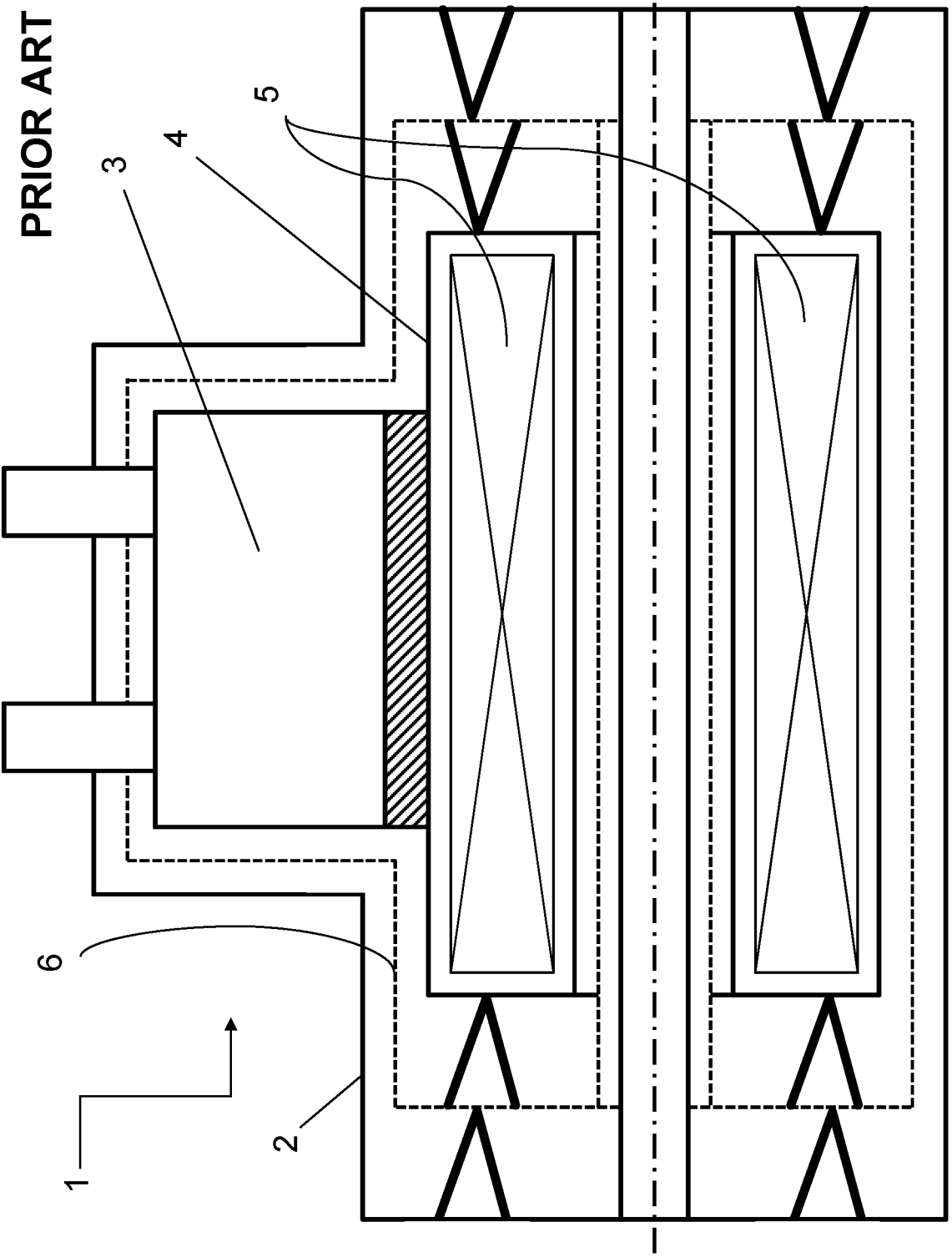
FIG. 2 is a vertical sectional view of a cryostat assembly according to the prior art.

FIGS. 1 and 3 to 8 of the drawings are each schematic views showing different details of preferred embodiments of the cryostat assembly according to the invention for cooling a superconducting magnet assembly, while FIG. 2 illustrates a generic cryostat assembly according to the closest prior art.

A cryostat assembly 1 of this kind has an outer container 2 in which a storage tank 3 with a first cryogenic fluid and a coil tank 4 with a superconducting magnet coil system 5 to be cooled are arranged. The magnet coil system 5 is cooled, at least in an operating state, by a second cryogenic fluid whose temperature is lower than that of the first cryogenic fluid. The coil tank 4 is mechanically connected to the outer container 2 and/or to one or more radiation shields 6 surrounding the coil tank 4 with a mounting structure at least during a transport state.

The present invention broadens this per se known assembly by the following elements associated with the invention. The cryostat assembly 1 according to the invention is distinguished from the apparatuses of the prior art in that the mounting structure has a plurality of mounting elements 7; 7' which each have at least one thermally conductive contact point 7a; 7a' which are thermally coupled respectively to at least one heat sink, whose temperature is lower than or equal to that of the storage tank 3, via at least one thermal conductor element 8; 8'.

In embodiments of the invention, at least one heat sink to which the thermal conductor elements 8; 8' are coupled may comprise the storage tank 3, in particular consist of the storage tank 3 itself.

Subcooled helium is usually used as the second cryogenic fluid, the pressure of the subcooled helium being above that of the saturation vapor pressure corresponding to the temperature of the second cryogenic fluid.

The outer container 2 is normally designed as a vacuum container and the mounting elements 7; 7' attached to the coil tank 4 are mechanically mounted on the inside of a typically provided radiation shield 6, as can be clearly seen in FIG. 1.

FIG. 3 illustrates the embodiment of FIG. 1 in the region of the coil tank 4 in greater detail. Each mounting element then comprises at least one thermally conductive contact point 7a which is thermally coupled to a heat sink with a temperature that is lower than or equal to that of the storage tank 3 via a thermal conductor element 8.

The mounting elements 7; 7' can also be designed as strut elements. The thermally conductive contact points 7a; 7a' can then be glued onto or into the strut elements or can be co-wound in a wound structure of the strut elements.

The mechanical suspensions are usually made of GFRP. Structures (specifically the contact points) are glued/co-wound directly into the GFRP struts at a suitable point, and thermal contacting takes place via these structures. For the structures, a material with high thermal conductivity at low temperatures is preferred, for example high-purity copper or high-purity aluminum.

Details of another embodiment are shown in FIG. 4. Here, the mounting elements 7' have, on their end nearer the coil tank 4, a thermally conductive contact point 7a' which is in mechanical surface contact with the coil tank 4 via a thermally insulating plate 9, which acts as a distance piece, on the side facing away from the mounting element 7'.

The thermal conductor elements 8; 8' can be constructed from a strand or a rod, at least from a material with high thermal conductivity lambda at low temperatures. In other embodiments (not expressly shown in the drawings), the thermal conductor elements 8; 8' may also comprise a heat pipe or be constructed from a heat pipe. The thermal conductor elements 8; 8' may also comprise a radiation shield, in particular a 4.2 K radiation shield, or be constructed from such, which is also not expressly shown in the drawings.

Figure 5:
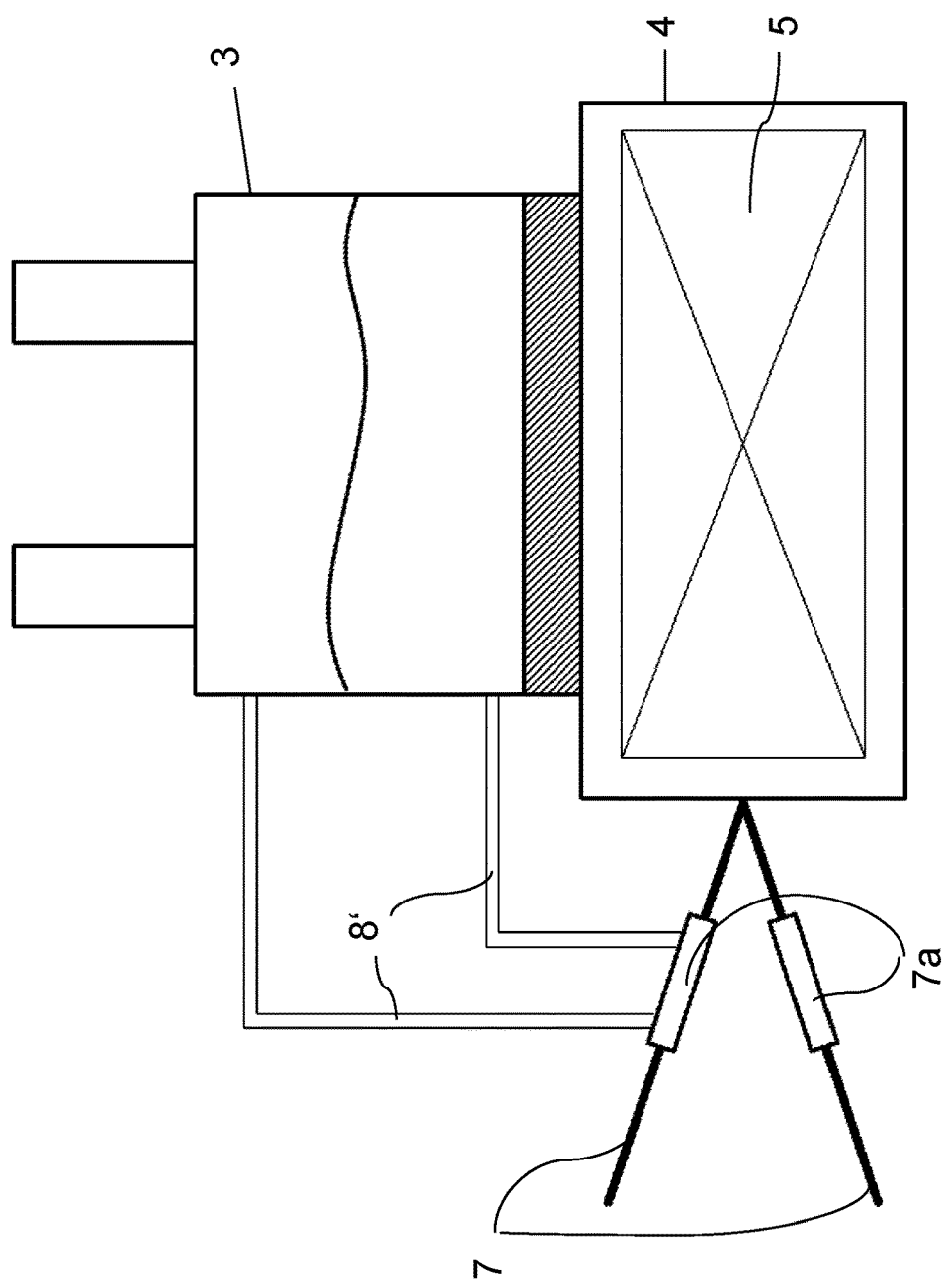
FIG. 5 is a detailed view of an embodiment in which the thermal conductor element comprises tube loops.

FIG. 5 shows an embodiment in which the thermal conductor element 8' comprises tube loops over which the contact points 7a and the storage tank 3, acting as the heat sink, are thermally coupled. The tube loops branch away from the storage tank 3 below a liquid surface of the first cryogenic fluid, lead to the contact points 7a, and then are returned to a location on the storage tank 3 which is above the liquid surface.

Figure 6:
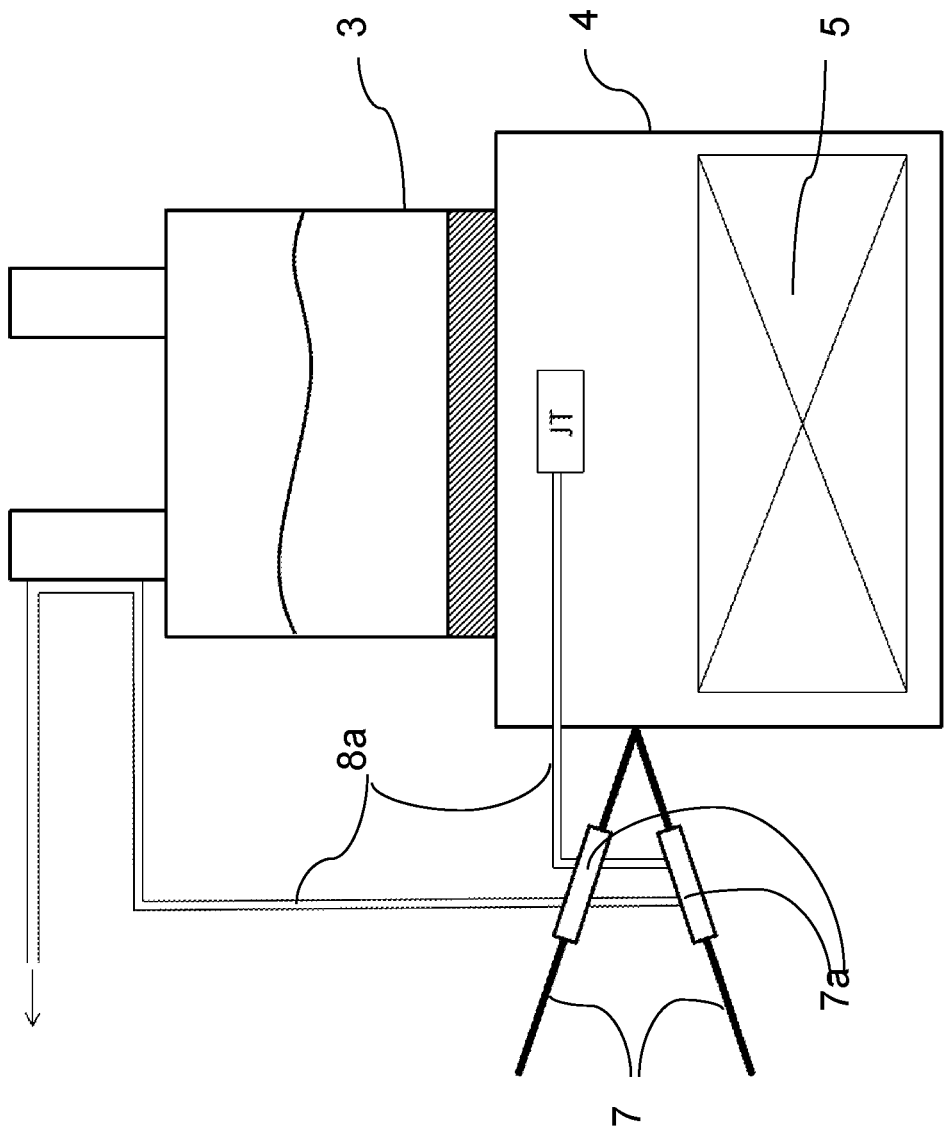
FIG. 6 is a detailed view of an embodiment in which the thermal conductor element comprises the exhaust gas line of an active cooler.

FIG. 6 shows an embodiment comprising an active cooler, in particular a Joule Thomson refrigerator JT. Subcooling pumps (not expressly shown in the drawings) are provided, which can continue to be operated using an uninterruptible power supply in the event of a power failure. In this embodiment, at least one heat sink comprises the exhaust gas of the active cooler, an exhaust gas line 8a of the active cooler being moved past the contact points 7a; 7a' serially or in parallel with thermal contact.

Thus, the unused cooling capacity between the temperature ranges of 2 K and 4.2 K of the LHe heat flow of 0.4 mW/(ml/h) is available to intercept the heat flowing through the supports in the coil tank 3. In an ideal case, this corresponds to almost half the cooling capacity of the refrigerator and can thus relieve it considerably, especially in an emergency. Even in normal operation, this assembly allows a significant reduction in heat flow. As a result, the exhaust gas from the JT cooler, as indicated in FIG. 6, can also be used to intercept the heat load in the neck tubes.

Figure 7:
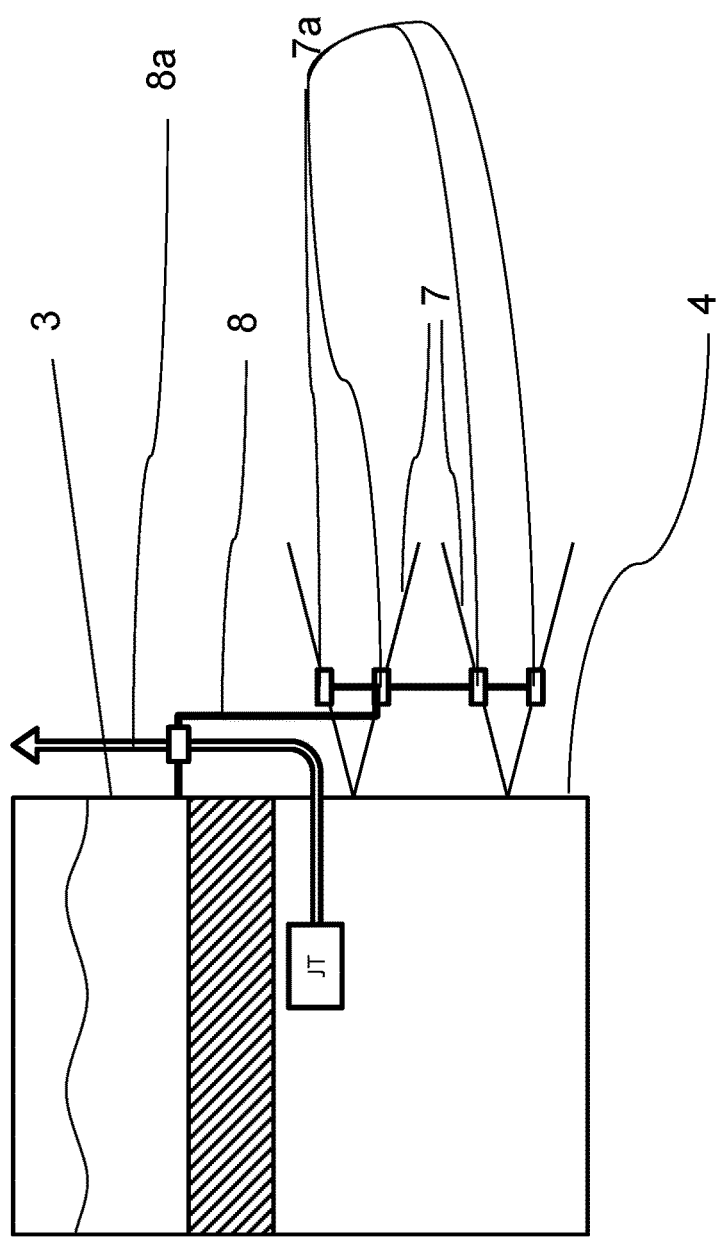
FIG. 7 is a detailed view of an embodiment in which the exhaust gas line of an active cooler crosses the thermal conductor element.

Another, optionally also supplementary, variant of the invention is shown in FIG. 7 in which, an active cooler is used, preferably again a Joule Thomson refrigerator JT. The exhaust gas line 8a of this cooler is "crossed" by the thermal conductor element 8 on its way to the heat sink.

In the event of a failure of the subcooling pumps, the exhaust gas line 8a runs full with LHe, the phase boundary (liquid-gaseous) then being set somewhere between the outlet from the coil tank 4 arranged below and the thermal coupling to the storage tank 3 arranged above. By suitable selection of the thermal positioning (for example by different conductivity of the thermally conductive contact points 7a on the one hand and the crossing region or the coupling region to the heat sink on the other hand), the system can be concerted between higher consumption reduction in continuous operation and loss reduction in the case of pump failure. In extreme cases, the thermal conductivity of the coupling region to the heat sink will be much greater than the conductivity of the thermal conductor element 8. In that case, the assembly is in an embodiment without heat flow coupling.

An advantageous development of this embodiment is shown in FIG. 8: in this embodiment, the thermal contact between the storage tank 3 and the exhaust gas line 8a is designed to be movable. For this purpose, a preloaded (for example by a spring) bellows element 10 mechanically connected to the interior of the exhaust gas line 8a is provided, with which element thermal contact can be made or broken. The bellows element 10 should generally be designed such that thermal contact is made only above an exhaust gas line pressure of 100 mbar (i.e. if and only if the pumps are no longer running).

The same principle is also feasable for vertical cryostats in which the mechanical suspensions engage directly on the coil tank, for example in order to make cold transportability possible.

The features of all the above-described embodiments of the invention may also be combined with one another at least in most cases.

LIST OF REFERENCES

Documents taken into consideration for the assessment of patentability
[1] EP 1 742 234 B1, US 2010/0236260 A1
[2] U.S. Pat. No. 5,220,800
[3] U.S. Pat. No. 5,586,437
[4] U.S. Pat. No. 6,011,454

LIST OF REFERENCE SIGNS

1 Cryostat assembly
2 Outer container
3 Storage tank
4 Coil tank
5 Superconducting magnet coil system
6 Radiation shield(s)
7; 7' Mounting elements
7a; 7a' Thermally conductive contact points
8; 8' Thermal conductor element(s)
8a Exhaust gas line of the active cooler
9 Thermally insulating plate
10 Bellows element
JT Joule Thomson refrigerator

What is claimed is:

1. Cryostat assembly comprising:
an outer container in which a storage tank with a first cryogenic fluid and a coil tank with a superconducting magnet coil system to be cooled are arranged,
wherein the magnet coil system is cooled at least in an operating state by a second cryogenic fluid whose temperature is below that of the first cryogenic fluid, and
a mounting structure mechanically connecting the coil tank to the outer container and/or to at least one radiation shield surrounding the coil tank at least during a transport state of the assembly,
wherein the first cryogenic fluid is liquid helium at an operating temperature of approximately 4.2 K in the storage tank and the second cryogenic fluid is helium at an operating temperature of <3.5 K in the coil tank, and
wherein the mounting structure comprises a plurality of mounting elements each of which has at least one thermally conductive contact point which is thermally coupled, through at least one thermal conductor element, to at least one heat sink, whose temperature is lower than or equal to that of the storage tank.

2. Cryostat assembly according to claim 1, wherein the second cryogenic fluid is subcooled helium, wherein the pressure of the subcooled helium is above a saturation vapor pressure corresponding to the temperature of the second cryogenic fluid.

3. Cryostat assembly according to claim 1, wherein the mounting elements are made of a material for which, for a ratio $\sigma/\theta$ of maximum permissible mechanical stress $\sigma$, with $\sigma>100$ MPa, to an integral $\theta$ of a thermal conductivity $\lambda$ over a temperature range $\Delta T$ between 300 K and 4 K, with $\theta<300$ W/m, the following applies: $\sigma/\theta>1/3$ (MPa·m)/W.

4. Cryostat assembly according to claim 1, wherein the mounting elements are made of plastics material.

5. Cryostat assembly according to claim 4, wherein the mounting elements are made of fiber-reinforced plastics material.

6. Cryostat assembly according to claim 1, wherein the mounting elements are designed as strut elements, and wherein the thermally conductive contact points are glued onto or into the strut elements or are co-wound in a wound structure of the strut elements.

7. Cryostat assembly according to claim 1, wherein the mounting elements are each shaped as a loop, each of the loops having at least one thermally conductive contact point.

8. Cryostat assembly according to claim 1, wherein the mounting elements each have, on an end thereof nearer the coil tank, a thermally conductive contact point which is in mechanical surface contact with the coil tank via a thermally insulating plate on a side thereof facing away from the mounting element.

9. Cryostat assembly according to claim 1, wherein the thermal conductor element is constructed from a strand or a rod and is made of a material with high thermal conductivity lambda at low temperatures.

10. Cryostat assembly according to claim 9, wherein the high thermal conductivity at low temperatures is lambda >250 W/(m*K) at a temperature of 4 K, and wherein the material is high-purity copper or high-purity aluminum.

11. Cryostat assembly according to claim 1, wherein the thermal conductor element comprises a heat pipe or is constructed from a heat pipe.

12. Cryostat assembly according to claim 1, wherein the thermal conductor element comprises a radiation shield or is constructed from a radiation shield.

13. Cryostat assembly according to claim 12, wherein the radiation shield comprises or is constructed from a 4.2 K radiation shield.

14. Cryostat assembly according to claim 1, wherein the at least one heat sink comprises or consists essentially of the storage tank.

15. Cryostat assembly according to claim 14, wherein the thermal conductor element comprises tube loops with which the contact points and the storage tank are thermally coupled, and wherein the tube loops branch away from the storage tank below a liquid surface of the first cryogenic fluid, lead to the contact points, and then return to a location on the storage tank which is above the liquid surface.

16. Cryostat assembly according to claim 1, further comprising:
    an active cooler comprising subcooling pumps, configured to operate with an uninterruptible power supply in the event of a power failure, wherein the at least one heat sink comprises an exhaust gas of the active cooler, and wherein the active cooler further comprises an exhaust gas line moved past the at least one contact point serially or in parallel with thermal contact.

17. Cryostat assembly according to claim 16, wherein the active cooler comprises a Joule Thomson refrigerator.

18. Cryostat assembly according to claim 16, wherein the thermal contact between the storage tank and the exhaust gas line is configured as a movable contact which is connected to an interior of the exhaust gas line and with which contact is alternatingly made or broken.

19. Cryostat assembly according to claim 18, wherein the thermal contact comprises a mechanically preloaded bellows element which is connected to the interior of the exhaust gas line such that thermal contact is made only above an exhaust gas line pressure of 100 mbar.

20. Cryostat assembly according to claim 1, further comprising a room temperature bore with a horizontal axis.

* * * * *